(12) United States Patent
Teo et al.

(10) Patent No.: US 7,994,010 B2
(45) Date of Patent: Aug. 9, 2011

(54) PROCESS FOR FABRICATING A SEMICONDUCTOR DEVICE HAVING EMBEDDED EPITAXIAL REGIONS

(75) Inventors: Lee Wee Teo, Singapore (SG); Alain Chan, Hong Kong (HK); Chung Foong Tan, Singapore (SG); Elgin Kiok Boone Quek, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 244 days.

(21) Appl. No.: 11/965,415

(22) Filed: Dec. 27, 2007

(65) Prior Publication Data

US 2009/0170268 A1 Jul. 2, 2009

(51) Int. Cl.
*H01L 21/336* (2006.01)
(52) U.S. Cl. ...................................................... 438/285
(58) Field of Classification Search .................. 438/285, 438/44, 222, 300; 257/E21.09–E21.134, 257/E21.461–E21.465
See application file for complete search history.

(56) References Cited

U.S. PATENT DOCUMENTS

| 5,729,056 | A | * | 3/1998 | Sung | 257/774 |
| 6,762,106 | B2 | | 7/2004 | Aoki et al. | |
| 6,852,559 | B2 | | 2/2005 | Kwak et al. | |
| 7,166,528 | B2 | | 1/2007 | Kim et al. | |
| 7,195,985 | B2 | | 3/2007 | Murthy et al. | |
| 2007/0001162 | A1 | * | 1/2007 | Orlowski et al. | 257/19 |
| 2007/0132038 | A1 | | 6/2007 | Chong et al. | |
| 2007/0196989 | A1 | * | 8/2007 | Kim et al. | 438/300 |
| 2008/0299724 | A1 | * | 12/2008 | Grudowski et al. | 438/257 |

* cited by examiner

*Primary Examiner* — Ha Tran T Nguyen
*Assistant Examiner* — Shaun Campbell
(74) *Attorney, Agent, or Firm* — Brinks Hofer Gilson & Lione

(57) ABSTRACT

A process for fabricating a semiconductor device, such as a strained-channel transistor, includes forming epitaxial regions in a substrate in proximity to a gate electrode in which the surface profile of the epitaxial regions is defined by masking sidewall spacers adjacent the gate electrode. The epitaxial regions are formed by depositing an epitaxial material into cavities selectively etched into the semiconductor substrate on either side of the gate electrode. The masking sidewall spacers limit the thickness of the epitaxial deposited material in proximity of the gate electrode, such that the upper surface of the epitaxial material is substantially the same as the principal surface of the semiconductor substrate. Doped regions are formed in the channel region beneath the gate electrode using an angled ion beam, such that doping profiles of the implanted regions are substantially unaffected by surface irregularities in the epitaxially-deposited material.

19 Claims, 3 Drawing Sheets

PROCESS FOR FABRICATING A SEMICONDUCTOR DEVICE HAVING EMBEDDED EPITAXIAL REGIONS

TECHNICAL FIELD

The present invention relates generally, to fabrication of semiconductor devices and, more particularly, to the fabrication of semiconductor devices having embedded epitaxially grown regions therein.

BACKGROUND

As the demand for higher performance semiconductor devices, such as integrated circuits (ICs) increases, manufactures strive to improve the performance of the individual components of the integrated circuits. In particular, field affect transistors (FETs) represent major components of integrated circuits and increasing the switching speed of FETs in many cases leads directly to improved IC performance. One method of increasing transistor switching speed is to increase the carrier mobility of the FETs. This is particularly important with respect to PMOS metal-oxide-semiconductor (MOS) transistors that are typically used in complimentary-MOS (CMOS) devices. To increase the switching speed and current gain within P-type MOS (PMOS) transistors, techniques have been developed to apply stress to the channel regions of the PMOS transistors. Applying stress and strain to the channel region of PMOS transistors strings the crystal and lattice within the channel region. In the case of silicon substrate technology, the Si—Si bonds are stressed, such that charge carriers move through the lattice at much higher rates than in an unstrained lattice.

A well-known technique for applying stress to the channel region of PMOS devices is to embed a silicon-germanium (SiGe) region into the source and drain regions of the FET. The lattice constant of SiGe does not match the lattice constant of a crystalline silicon substrate. Accordingly, stress (or more commonly referred to as "strain") is created at the interface between the SiGe and the silicon substrate. Where SiGe material is embedded on opposite sides of the channel, the strain propagates through the region of the silicon lattice forming the channel of the FET.

While embedding SiGe in the source and drain regions of a PMOS transistor improves the transistor performance, integration of an embedded SiGe material into a CMOS process flow is extremely challenging. A common technique for introducing SiGe involves the epitaxial deposition of SiGe in regions of the substrate adjacent the gate electrode of the FET. For example, U.S. Pat. Pub. No. 2007/132038 describes a technique for embedding epitaxially-grown SiGe in the source and drain regions of an FET. The technique involves forming recesses in the substrate and epitaxially depositing SiGe into the source and drain regions of the substrate. The epitaxial deposition process is carried out for a predetermined amount of time in order to form a SiGe layer to a predetermined thickness.

Various substrate etching and epitaxial deposition techniques have been developed to provide epitaxial source and drain regions. For example, U.S. Pat. No. 7,195,985 discloses an etching and deposition technique in which the substrate etching and the subsequent epitaxial deposition is performed in the same reactor.

Further development of deposition methods, such as selective deposition of SiGe layers is described in U.S. Pat. No. 7,166,528. A deposition technique is disclosed in which silane gas is used as a precursor for the selective deposition of silicon-containing compounds, such as SiGe. The process also includes the introduction of a dopant and an etchant during the SiGe epitaxial deposition process. The dopant provides the SiGe material with various conductive characteristics, and the etchant functions to remove SiGe from surface features of the substrate.

While the use of SiGe embedded regions in the source and drain regions of an FET provides an effective means for stressing the channel region of the FET and improving its performance, epitaxial deposition processes can be difficult to control. In particular, the thickness of the epitaxially-deposited SiGe is important to efficient device processing. The thickness of the SiGe needs to be carefully controlled in proximity to the gate electrode of a PMOS device in order to avoid interference with other process operations, such as ion implantation into the channel region. For example, halo regions and extension regions can be formed in the channel region using an angled ion implantation process. Excessive thickness of the epitaxially-deposited SiGe in proximity to the gate electrode can interfere with the angled ion implantation and alter the doping profile of implanted regions within the FET channel. Accordingly, improvements in process technology are necessary to provide improve control of the SiGe epitaxial deposition process used in the fabrication of semiconductor devices.

SUMMARY

In one embodiment, a process for fabricating a semiconductor device includes forming a device structure on a principal surface of the semiconductor substrate. Masking sidewall spacers are formed on the principal surface and in proximity to the device structure. A predefined doped portion of a substrate is selectively etched to form a cavity beneath the masking sidewall spacers. An epitaxial region is formed in the cavity, such that a surface profile of the epitaxial region is defined by the masking sidewall spacers. The surface profile includes a step region above the principal surface at a perimeter of the masking sidewall spacers. The step region is spaced away from the device structure by the masking sidewall spacers.

In another embodiment, a process for fabricating a semiconductor device includes forming a gate electrode on a substrate surface and forming first sidewall spacers adjacent to the gate electrode. The substrate is doped with a conductivity-determining dopant using the sidewall spacers as a doping mask to form a doped substrate region. Second sidewall spacers are formed adjacent to the first sidewall spacers and the doped region of a substrate is selectively etched to form cavities extending under the second sidewall spacer. The cavities are spaced apart by a channel region of the substrate underlying the gate electrode and the first sidewall spacers. The cavities are filled with an epitaxially-deposited material. A surface profile of the epitaxial material includes a step region above the substrate surface and spaced away from the gate electrode by the first and second sidewall spacers. The channel region is implanted using an angled ion beam.

In yet another embodiment, a process forming a strained-channel transistor having embedded epitaxial source and drain regions includes forming the epitaxial regions in a substrate in proximity to a gate electrode. The epitaxial regions are spaced apart from the gate electrode by one or more sidewall spacers adjacent to the gate electrode. The sidewall spacers limit the depth of the epitaxial regions in proximity to the gate electrode. Surface irregularities in the epitaxial regions are created at the perimeter of the sidewall spacers. Doped regions are formed in the substrate in proximity to the gate electrode, where a lateral distance of one or more of the sidewall spacer is sufficient to substantially prevent the surface irregularities from altering the doping profiles of the doped regions in the substrate.

DETAILED DESCRIPTION

Figure 1:
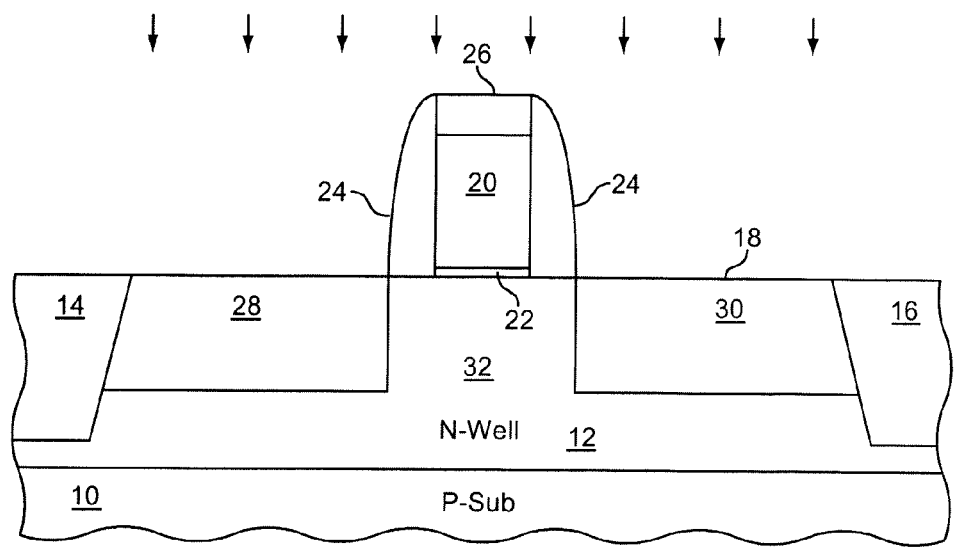
FIGS. 1-6 illustrate, and cross-section, process steps in accordance with one embodiment of the invention.
Figure 2:
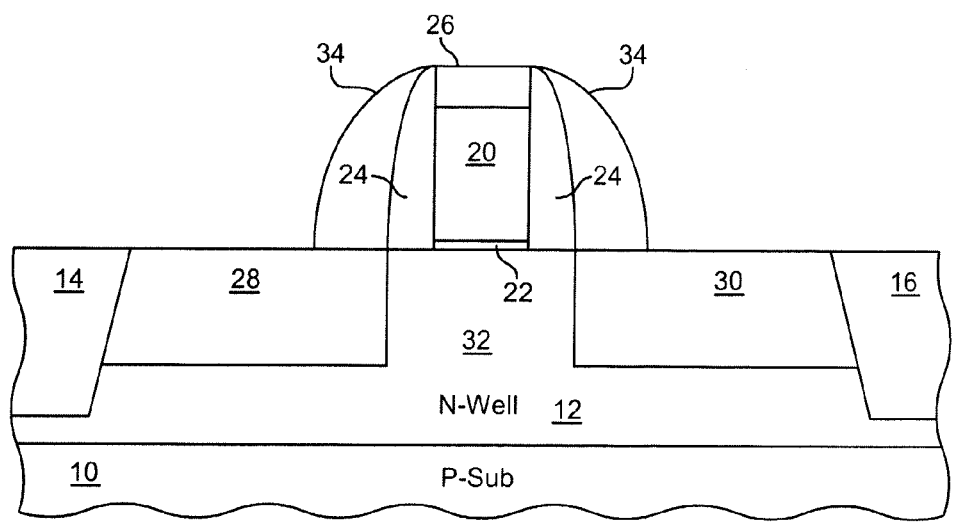

Shown in FIG. 1 is a semiconductor substrate 10 having already undergone several processing steps in accordance with an aspect of the invention. In one embodiment, semiconductor substrate 10 is a PMOS substrate having an N-type well region 12 formed therein. Isolation regions 14 and 16 reside in semiconductor substrate 10 and bound a principal surface 18 of semiconductor substrate 10. A gate electrode 20 overlies principal surface 18 and is separated therefrom by a gate dielectric layer 22. First sidewall spacers 24 reside adjacent to the sidewalls of gate electrode 20. A capping layer 26 overlies the upper surface of gate electrode 20.

Doped regions 28 and 30 are created by introducing a dopant into semiconductor substrate 10 through principal surface 18. In one embodiment, an N-type dopant (As), antimony (Sb), and the like is implanted into semiconductor substrate 10 using first sidewall spacers 24 as an implant doping mask. The doping process leaves a channel region 32 underlying gate electrode 20 and first sidewall spacers 24. Channel region 32 separates doped region 28 from doped region 30 in semiconductor substrate 10. Those skilled in the art will recognize the structural embodiment illustrated in FIG. 1 as depicting electrode regions of an MOS transistor, such that doped regions 28 and 32 are source and drain regions self-aligned to gate electrode 20 and first sidewall spacers 24. Further, channel region 32 extends between the source and drain regions below gate electrode 20 and in proximity to principal surface 18 of semiconductor substrate 10.

Those skilled in the art will appreciate that although the foregoing exemplary embodiment is described with respect to a P-type substrate having an N-type well region, other configurations are possible. For example, the present invention can be practiced with substrates having a conductivity that is opposite to that shown in the figures. Further, the present invention can also be practiced with silicon-on-insulator (SOI) substrates having a thin semiconductor layer overlying an insulating region.

In aspect of the invention in which a PMOS FET is fabricated, gate electrode 20 is preferably formed by the deposition and etching of polycrystalline silicon. Further, isolation regions 14 and 16 are shallow-trench-isolation (STI) regions formed by depositing silicon oxide into trenches formed in semiconductor substrate 10. Further, semiconductor substrate 10 is preferably a single crystal silicon substrate material in which phosphorous or arsenic is introduced in well region 12. Further, sidewall first sidewall spacers 24 and capping layer 26 are typically formed by depositing and etching insulating materials, such as silicon oxide, silicon nitrate, and the like. Gate dielectric layer 22 is typically a thermally grown silicon oxide material.

Those skilled in the art will appreciate that although the structure illustrated in FIG. 1 has been described in the context of commonly used semiconductor materials, numerous different materials can be used to fabricate the gate structure illustrated in FIG. 1. For example, various refractory materials can be included to form refractory metal silicides and the like for the fabrication of the electrode 20. Further, various dielectric materials, such as high-K dielectric materials, ceramic materials, and the like, can be used to form gate dielectric layer 22.

The inventive process continues with the formation of masking sidewall spacers 34 adjacent to first sidewall spacers 24. Preferably, masking sidewalls spacers 34 are formed by the deposition an anisotropic etching of a material that is differentially etchable with respect to doped regions 28 and 30 of semiconductor substrate 10. For example, the various spacer-forming materials, such as spin-on-glass, silicon oxides, silicon nitrates, and the like, can be used.

Figure 3:
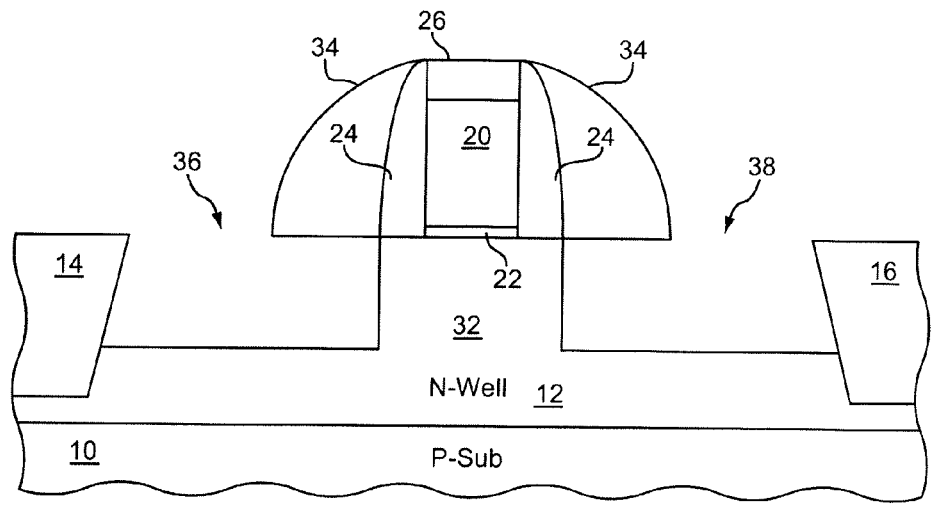

Referring to FIG. 3, after forming masking sidewalls spacers 34, the inventive process continues with the selective etching of doped regions 28 and 30 in semiconductor substrate 10. The dope regions are selectively etched by using an etchant that differentially etches the N-type semiconductor material of doped regions 28 and 30, while not substantially etching masking sidewall spacers 34 or isolation regions 14 and 16. In a preferred embodiment, a selective, isotropic reactive-ion-etching (RIE) process is used to substantially remove now doped regions 28 and 30 and to form recesses or cavities 36 and 38 in semiconductor substrate 10. The isotropic etching process is carried out to both vertically and laterally etch doped regions 28 and 30, such that cavities 36 and 38 are formed beneath masking sidewall spacers 34. The RIE process is preferably carried out with etching chemistry that selectively etches the N-type semiconductor material of doped regions 28 and 30, while not substantially etching other portions of semiconductor substrate 10. In one embodiment, a plasma is generated in the RIE apparatus by generating a chlorine or bromine-based plasma in the etching chamber.

Figure 4:
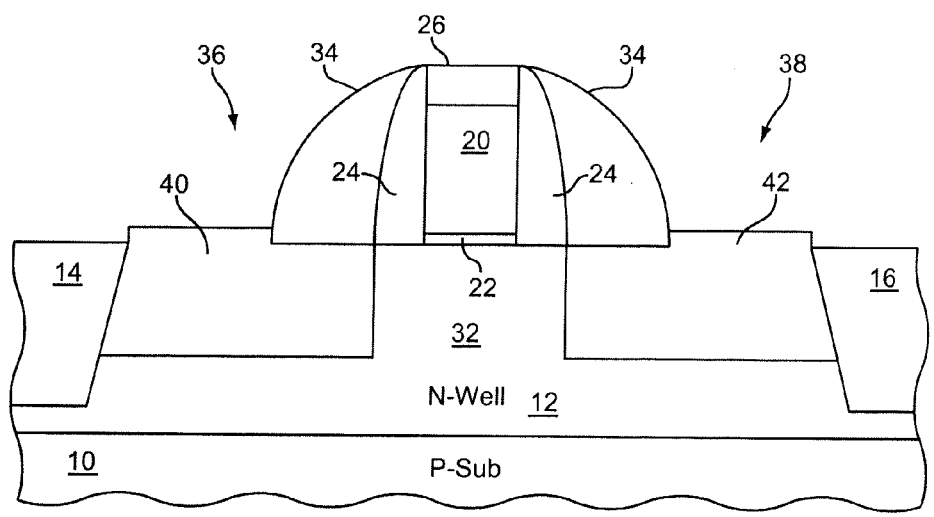

Once cavities 36 and 38 are formed, an epitaxial deposition process is carried out to form epitaxial regions 40 and 42 in cavities 36 and 38, respectively, as illustrate in FIG. 4. The epitaxial deposition process successively deposits layers of SiGe into cavities 36 and 38 and progressively builds the epitaxial regions to fill the cavities. Notably, masking sidewall spacers 34 limit the thickness of epitaxial regions 40 and 42 in proximity to gate electrode 20. Further, the surface profile of epitaxial regions 40 and 42 is defined by masking sidewall spacers 34. In particular, the thickness of epitaxial regions 40 and 42 in proximity to gate electrode 20 and channel region 32 is limited by masking sidewall spacers 34. Accordingly, the epitaxial deposition process will form an epitaxial region having an upper surface in proximity to gate electrode 20 that is coextensive with principal 18 (shown in FIG. 1), regardless of any variance in the epitaxial deposition process.

By limiting the thickness of epitaxial regions 40 and 42 in proximity to gate electrode 20 and channel region 32, a controlled amount of stress is introduced into channel region 32 that does not vary with the process variances in the epitaxial deposition process. Further, surface irregularities within epitaxial regions 40 and 42 are spaced away from gate electrode 20 and channel region 32 by first sidewall spacers 24 and masking sidewall spacers 34.

Figure 5:
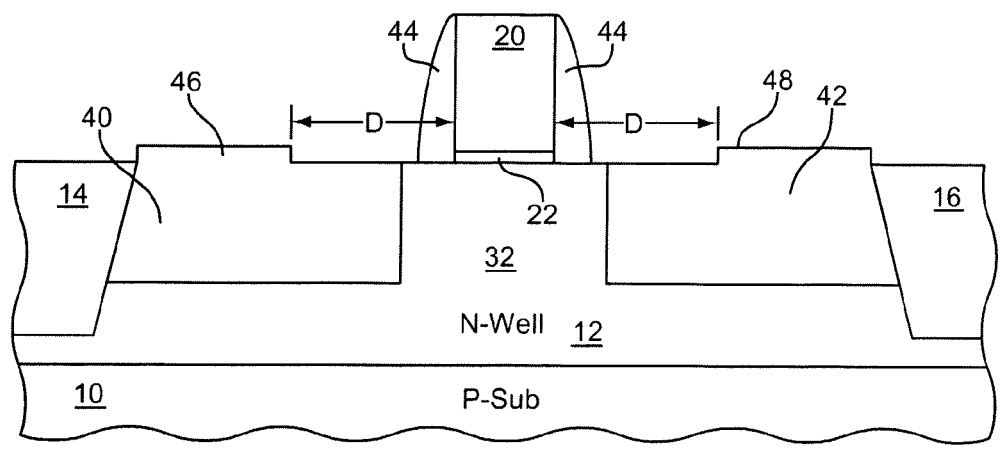

After forming epitaxial regions 40 and 42, masking sidewall spacers 34, first sidewall spacers 24, and capping layer 26 are removed. Then, as illustrated in FIG. 5, second sidewall spacers 44 are formed adjacent the sidewalls of gate electrode 20. As illustrated in FIG. 5, epitaxial regions 40 and 42 have a surface profile that includes step regions 46 and 48, respectively. Step regions 46 and 48 result from the epitaxial growth of SiGe above the principal surface of semiconductor substrate 10 during the epitaxial deposition process. Notably, step regions 46 and 48 are spaced away from gate electrode 20 by the combined lateral distances D of first sidewall spacers 24 and masking sidewall spacers 34. As will subsequently be described, the lateral distance D is sufficient to substantially prevent step regions 46 and 48 from interfering with subsequent implantation processes. Significantly, by standing surface irregularities of the epitaxial regions, such as step regions 46 and 48 away from gate electrode 20, a fabrication process is provided in which channel implantation is carried out after forming the epitaxial regions, rather than before forming the epitaxial regions. Those skilled in the art will recognize that, in the illustrated embodiment, epitaxial regions 40 and 42 form embedded source and drain regions, and that channel region 32 extends between the embedded source and drain regions beneath gate electrode 20 and in proximity to the surface of semiconductor substrate 10.

Figure 6:
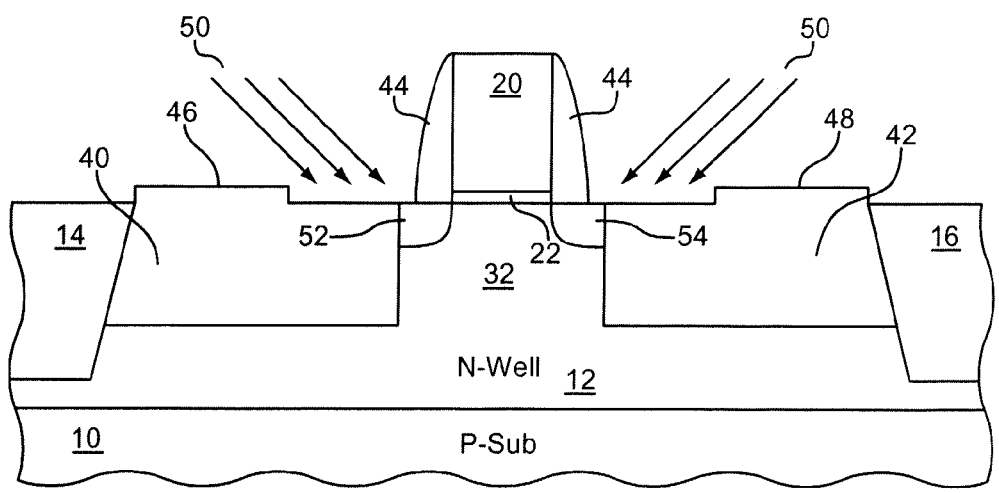

As illustrated in FIG. 6, an angled ion implantation process is carried out to form doped regions in channel region 32. Advantageously, surface irregularities, such as step regions 46 and 48 are removed from gate electrode 20 by a sufficient distance such that ion beams 50 are not disrupted. Accordingly, step regions 46 and 48 do not substantially interfere with angled ion beam 50 during the implantation process. The implantation process forms doped regions 52 and 54 in channel region 32. The doping profile of doped regions 52 and 54 and channel region 32 is substantially unaffected by step regions 46 and 48. In one aspect of the invention, doped regions 52 and 54 are halo implant regions and source-drain extension regions commonly used in MOS device fabrication. Accordingly, improved electrical performance is obtained in channel region 32 by the inventive process in which the epitaxial regions 40 and 42 are formed prior to forming dope regions 52 and 54.

Thus, it is apparent that there has been described, in accordance with the invention, a process for fabricating a semiconductor device having embedded epitaxial region that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, both PMOS and N-type transistors can be fabricated using the process technique described above. For example, N-type transistors having silicon carbide (SiC) epitaxial regions can be fabricated in accordance with the invention. Further, numerous process techniques can be used to fabricate transistors according to the invention. For example, molecular ion beam processes, electron-cyclotron-resonance etching process, and the like, can be used. It is therefore intended to include within the invention all such variations and modifications as falls within the scope of the appended claims and equivalence thereof.

The invention claimed is:

1. A process for fabricating a semiconductor device, the process comprising:
   forming a gate electrode on a principal surface of a semiconductor substrate;
   forming first sidewall spacers in contact with sidewalls of the gate electrode;
   forming a predefined doped portion in the semiconductor substrate using the first sidewall spacers as a doping mask;
   forming masking sidewall spacers on the predefined doped portion and adjacent to the first sidewall spacers;
   selectively etching away the predefined doped portion of the substrate to form a cavity beneath the masking sidewall spacers that extends across the width of a base of the masking sidewall spacers and leaving a channel region of the substrate beneath the first sidewall spacers;
   forming an epitaxial region in the cavity, such that a surface profile of the epitaxial region is defined by the masking sidewall spacers and includes a step region above the principal surface at a perimeter of the masking sidewall spacers and spaced away from the gate electrode by the first sidewall spacers and the masking sidewall spacers;
   removing the first sidewall spacers and the masking sidewall spacers and forming implant spacers adjacent to the gate electrode;
   implanting the channel region underlying the gate electrode using the implant spacers as a doping mask to form one or both of a halo region or an extension region in the channel region.

2. The process of claim 1, wherein implanting the channel region comprises using an angled ion beam, wherein the step region does not substantially interfere with the ion beam at the principal surface.

3. The process of claim 2, wherein forming a device structure comprises forming an MOS gate electrode, and wherein the ion beam forms one or both of a halo region or an extension region in the substrate, and wherein doping profiles of the halo region and the extension region are substantially unaffected by the step region.

4. The process of claim 1, wherein forming a predefined doped portion comprises implanting a conductivity-determining dopant into the substrate to form the predefined doped portion.

5. The process of claim 1, wherein forming an epitaxial region in the cavity comprises forming embedded epitiaxial source and drain regions.

6. The process of claim 1, wherein forming an epitaxial region comprises forming SiGe.

7. The process of claim 1, wherein selectively etching away a predefined doped portion of the substrate comprises doping portions of the substrate to be etched with an n-type dopant and applying a reactive ion etch process that selectively etches the doped portions of the substrate.

8. The process of claim 7, wherein doping portions of the substrate to be etched with an n-type dopant comprises doping with one of arsenic or antimony.

9. A process for fabricating a semiconductor device, the process comprising:
   forming a gate electrode on a substrate surface and forming first sidewall spacers adjacent to the gate electrode;
   doping the substrate with a conductivity-determining dopant using the first sidewall spacers as a doping mask to form a doped substrate region;
   forming second sidewall spacers on the doped substrate region adjacent to the first sidewall spacers;
   selectively etching the doped substrate region to form cavities extending under the second sidewall spacers and leaving a channel region beneath the first sidewall spacers,
   wherein the cavities are spaced apart by the channel region of the substrate underlying the gate electrode and the first sidewall spacers;
   filling the cavities with an epitaxially-deposited material and forming a surface profile of the epitaxial material that includes a step region above the substrate surface and spaced away from the gate electrode by a combined lateral distance of the first and second sidewall spacers on the substrate surface; and removing the first and second sidewall spacers and forming implant spacers adjacent to the gate electrode and implanting the channel region using an angled ion beam.

10. The process of claim 9, wherein doping the substrate with a conductivity-determining dopant comprises doping with an n-type dopant.

11. The process of claim 9, further comprising:
using the implant spacers as a doping mask to form one or both of a halo region or an extension region in the channel region,
wherein doping profiles of the halo region and the extension region are substantially unaffected by the step region.

12. The process of claim 9, wherein selectively etching the doped substrate region comprises applying a reactive ion etch process that selectively etches doped portions of the substrate, while leaving undoped portions substantially unetched.

13. The process of claim 12, wherein forming a gate electrode on a substrate surface comprises forming the gate electrode on a well region of the substrate, and wherein selectively etching the doped substrate region to form cavities comprises forming cavities in the well region.

14. The process of claim 9, wherein filling the cavities with an epitaxially-deposited material comprises filling the cavities with SiGe.

15. A process for forming a strained-channel transistor having embedded epitaxial source and drain regions, the process comprising:
forming epitaxial regions in cavities in a substrate, the epitaxial regions in proximity to a gate electrode overlying a substrate surface and spaced apart from the gate electrode by first and second adjacent sidewall spacers on the substrate surface and in proximity to the gate electrode,
wherein the cavities are formed by forming a predefined doped portion in the substrate and selectively etching away the predefined doped portion of the substrate to form the cavities beneath at least a portion of the second sidewall spacers and leaving a channel region of the substrate beneath the first sidewall spacers,
wherein the first and second sidewall spacers limit the depth of the epitaxial regions in proximity to the gate electrode, and
wherein surface irregularites in the epitaxial regions are created at a perimeter of the second sidewall spacers and are spaced away from the gate electrode by a combined lateral distance of first and second sidewall spacers;
removing the first and second adjacent sidewall spacers and forming implant spacers adjacent to the gate electrode; and
forming doped regions in the channel region of the substrate,
wherein a lateral distance of the first and second sidewall spacers is sufficient to substantially prevent the surface irregularities of the epitaxial regions from altering doping profiles of the doped regions.

16. The process of claim 15, wherein forming doped regions in the substrate comprises using an angled ion implantation process.

17. The process of claim 15, wherein the cavities are spaced apart by a channel region of the substrate underlying the gate electrode and the first sidewall spacers, and wherein forming epitaxial regions comprises filling the cavities with an epitaxially deposited material.

18. The process of claim 17, wherein filling the cavities with an epitaxially-deposited material comprises filling the cavities with SiGe.

19. The process of claim 17, wherein selectively etching the substrate comprises applying a reactive ion etch process that selectively etches doped portions of the substrate, while leaving undoped portions substantially unetched.

* * * * *